United States Patent [19]
Okanobu

[11] Patent Number: 4,578,807
[45] Date of Patent: Mar. 25, 1986

[54] FM STEREO MULTIPLEX DEMODULATOR

[75] Inventor: Taiwa Okanobu, Tokyo, Japan

[73] Assignee: Sony Corporation, Tokyo, Japan

[21] Appl. No.: 618,218

[22] Filed: Jun. 7, 1984

[30] Foreign Application Priority Data

Jun. 8, 1983 [JP] Japan .................... 58-102344

[51] Int. Cl.$^4$ .................................. H04H 5/00
[52] U.S. Cl. .......................... 381/7; 329/123; 329/167; 455/214
[58] Field of Search .............. 381/3, 4, 7; 329/50, 329/122, 123, 163, 167; 330/257, 288; 455/214

[56] References Cited

U.S. PATENT DOCUMENTS

| | | | |
|---|---|---|---|
| 4,049,918 | 9/1977 | Ohsawa | 381/4 |
| 4,054,839 | 10/1977 | Ohsawa | 381/7 |
| 4,074,075 | 2/1978 | Ohsawa | 329/167 |
| 4,115,663 | 9/1978 | De Weger | 381/7 |
| 4,140,878 | 2/1979 | Ohsawa | 381/7 |
| 4,167,649 | 9/1979 | Ohsawa et al. | 381/7 |
| 4,390,746 | 6/1983 | Higashiyama et al. | 329/167 |

*Primary Examiner*—Forester W. Isen
*Attorney, Agent, or Firm*—Lewis H. Eslinger; Alvin Sinderbrand

[57] ABSTRACT

A composite FM stereo multiplex signal is demodulated using a double-balanced switching circuit cooperating with current mirror circuits so that demodulation and separation of the multiplexed signals occurs in the current domain. The switching circuit receives a switching signal that is a sub-carrier frequency of the FM stereo multiplex carrier signal, and the switching circuit is provided with the composite stereo signal as a output current signal from a first current mirror circuit. Outputs from the switching circuit are then fed to respective left and right channel current mirror circuits where the current output signals therefrom are substracted in respective current difference circuits from the composite current output signal produced by the first current mirror circuit, thereby producing left and right channel stereo signals having predetermined separation and signal-to-noise ratio.

18 Claims, 3 Drawing Figures

F/G. 1

FM STEREO MULTIPLEX DEMODULATOR

BACKGROUND OF THE INVENTION

1. Field of the Invention

The present invention relates generally to multiplex demodulators and specifically to FM stereo multiplex demodulators suitable for use with an FM stereo receiver.

2. Description of the Prior Art

In FM stereo broadcasting it is known to use the following, or similar, signal processing steps in order to demodulate a composite signal and to provide the left and right channel stereo audio signals. First, the composite signal is demodulated by a switching signal having the sub-carrier frequency, so that the composite signal is demodulated into left and right channel audio signals. Because of this demodulation technique these left and right channel signals have a crosstalk component, and this must then be cancelled from the demodulated audio signals. The last step is typically a deemphasis step which is carried out in order to bring the transmitted signals back to the correct level. The deemphasis is required because it is the general approach to emphasize the high-frequency end of the signal prior to transmission.

Nevertheless, while this known FM stereo multiplex demodulation technique is acceptable in some situations, if large amplitude operation is required when the power source voltage is low a large amount of unacceptable distortion will be present. Therefore, when the known FM stereo multiplex demodulator is operated by a battery, that is, a relatively low voltage power source, the signal level must be kept quite small, thereby resulting in obvious disadvantages in relation to the signal-to-noise ratio (S/N).

OBJECTS AND SUMMARY OF THE INVENTION

Accordingly, it is an object of the present invention to provide an improved FM stereo multiplex demodulator that overcomes the drawbacks inherent in the prior art.

Another object of the present invention is to provide an FM stereo multiplex demodulator that can produce the left and right channel audio signals with excellent signal-to-noise ratio and low distortion characteristics even when used with a low voltage power source.

It is still another object of the present invention to provide an FM stereo multiplex demodulator that prevents crosstalk between the circuit elements forming the multiplex demodulator.

A further object of the present invention is to provide an FM stereo multiplex demodulator that can be advantageously formed as an integrated circuit.

A still further object of the present invention is to provide an FM stereo multiplex demodulator suitable for use in an FM stereo receiver.

According to one aspect of the present invention, an FM stereo multiplex demodulator includes a double-balanced switching circuit to which a switching signal is supplied and a first current mirror circuit that has a composite FM stereo multiplex signal applied to an input and whose output current is fed to the switching circuit. Additional current mirror circuits are supplied with output current signals from the switching circuit and a first signal combining circuit produces a current output corresponding to a difference between an output current from one of the current mirror circuits and the current flowing in the first current mirror circuit and a second signal combining circuit also produces an output current signal corresponding to a difference between the output current from one of the current mirror circuits and the current flowing in the first current mirror circuit. These output currents from the signal combining circuits are converted to a voltage, are deemphasized, and correspond to the left and right channel audio signals.

All of the circuit elements in the present invention are operated by current, that is, they are not voltage dependent, and this means that even if the power source voltage is low it is still possible to obtain the left and right channel audio signals with a sufficiently large amplitude, low distortion, and excellent signal-to-noise ratio. For example, it has been found that satisfactory signal-to-noise ratio and distortion characteristics can be obtained even when the power source voltage equals 1.8 volts.

The above, and other objects features and advantages of the present invention will become apparent from the following detailed description of illustrated embodiments thereof to be read in conjunction with the accompanying drawings, in which like reference numerals represent the same or similar parts.

DESCRIPTION OF PREFERRED EMBODIMENTS

Figure 1:
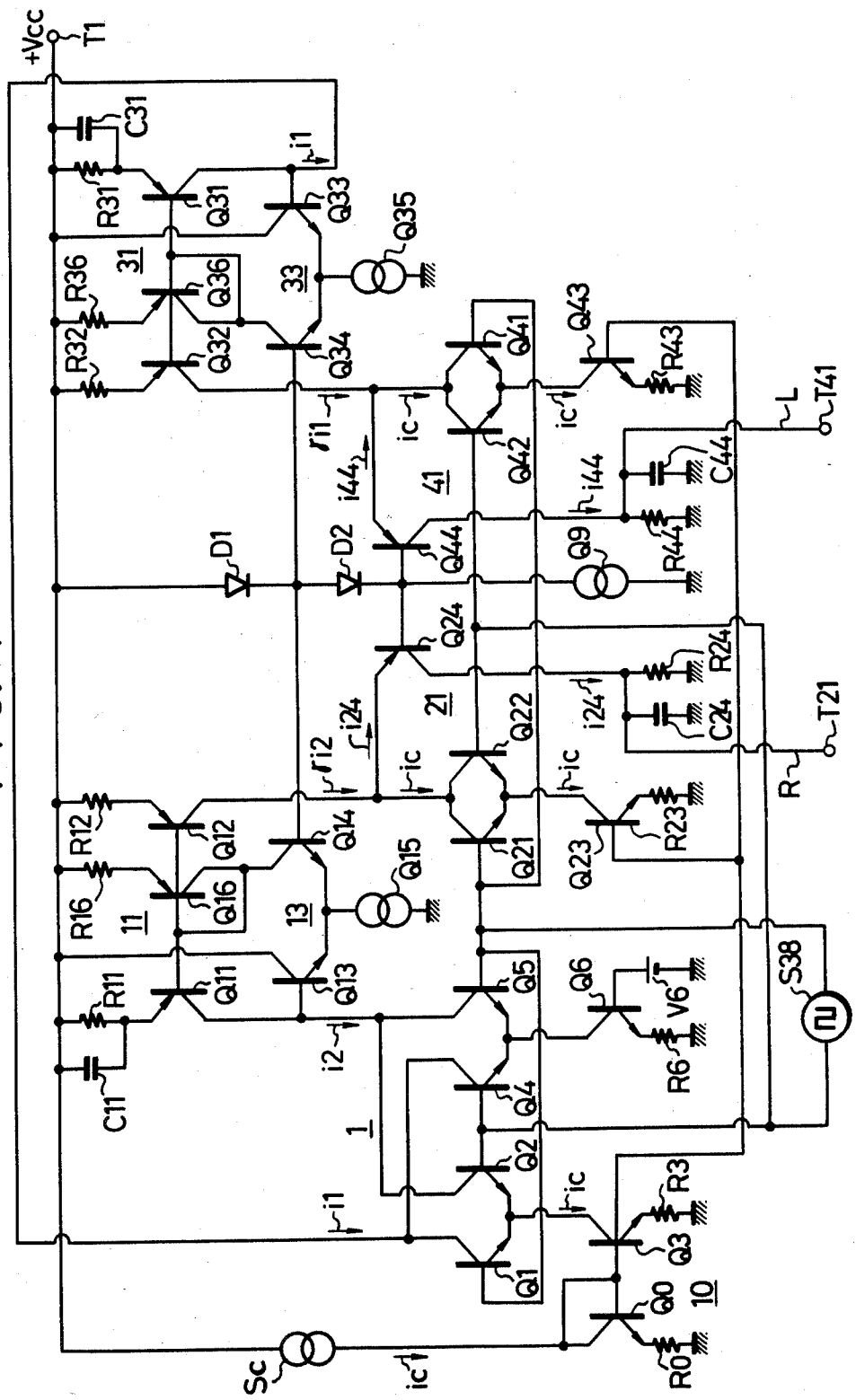
FIG. 1 is a schematic diagram showing a circuit for an FM stereo multiplex demodulator according to one embodiment of the present invention.

FIG. 1 is a schematic circuit diagram of an FM stereo multiplex demodulator according to one embodiment of the present invention in which a double-balanced switching circuit 1 acts as the demodulator. Switching circuit 1 is comprised of transistors Q1, Q2, Q4, and Q5 connected such that the emitter circuits of transistors Q1 and Q2 are commonly connected to the collector circuit of transistor Q3, with the emitter circuit of transistor Q3 being connected to relative ground potential through resistor R3. Similarly, the emitter circuits of transistors Q4 and Q5 are connected in common and are connected to relative ground potential through the collector emitter path of transistor Q6 and resistor R6, which is connected in the emitter circuit of transistor Q6. Transistor Q6 operates as a constant current source by connecting the base lead thereof to a voltage source V6 that is connected to relative ground potential. In this doubled-balanced switching circuit 1, the base circuits of transistors Q1 and Q5 are connected together and the base leads of transistors Q2 and Q4 are connected together, and transistor Q1 has its collector circuit connected to the collector circuit of transistor Q4 and, similarly, transistor Q2 has its collector circuit connected to the collector circuit of transistor Q5.

Transistor Q3 and resistor R3 form part of a first or main current mirror circuit 10, which also includes transistor Q0 that has its emitter circuit connected to relative ground potential through resistor R0 and has its base circuit connected to the base circuit of transistor Q3, in the known current mirror circuit configuration. Transistor Q0 has its collector circuit tied to its base circuit to provide a constant base drive in the well known manner. Transistor Q0 forms the input side of current mirror circuit 10 and transistor Q3 forms one of the output sides thereof. In addition to transistor Q3 forming one output side of the current mirror circuit 10, transistor Q23 forms another output side of current mirror circuit 10 and has its emitter circuit connected to relative ground through potential resistor R23, and transistor Q43 forms another output side of current mirror circuit 10 and has its emitter circuit connected to relative ground potential through resistor R43. In current mirror circuit 10, the base circuits of transistors Q3, Q23, and Q43 must all be connected in common to the base circuit of transistor Q0, which forms the input side transistor, and the current mirror circuit 10 employs relative ground potential as the reference potential point.

The multiplexed FM stereo signal to be demodulated is represented as a constant current signal source Sc connected to drive the collector circuit of transistor Q0 forming the input side of current mirror circuit 10. Double-balanced switching circuit 1 is then provided with a switching signal by switching signal source S38 connected at the common base connection of transistor Q2 and Q4 and at the common base connection of transistor Q1 and Q5.

In this embodiment of the FM stereo multiplex demodulator, the composite signal represented as being produced by constant signal source generator Sc provides an input current ic to the input side transistor Q0 of current mirror circuit 10 and this composite signal may be represented as:

$$i_c = (L+R) + (L-R)\sin \Omega t \qquad (1)$$

Where L represents the left channel audio signal, R represents the right channel audio signal; and represents the sub-carrier angular frequency. In this case is equal to $2\pi \times 38$ kHz. Additionally, the signal $i_c$ of equation (1) above is impressed upon a DC component having a level dependent on these specific voltage values selected, however, the DC components of the collector circuits of transistors Q3 and Q6 are selected to be equal to each other. The switching signal source is provided to supply a switching signal having a sub-carrier frequency of 38 kHz which is synchronized with the pilot signal frequency of 19 kHz.

The signal current i1 from the balanced switching circuit 1 is supplied to another current mirror circuit 11, formed of transistors Q11, Q12, and Q16, all of which have their base circuits connected in common, and the common base circuit is driven or clamped to a desired voltage by connecting the collector circuit of transistor Q16 to the common base connection of the three transistors Q11, Q12, and Q16. The output current from current mirror 11 is amplified by differential amplifier 13, formed of transistors Q13 and Q14 having their collector circuits commonly connected to constant current source Q15, which is connected to relative ground potential. The base circuit of transistor Q13 of differential amplifier 13 is connected to the collector circuit of transistor Q11, which forms the input side of current mirror circuit 11, and the base circuit of transistor Q14 is connected to a common connection between the cathode of diode D1 and the anode of diode D2. The collector circuit of transistor Q13 of differential amplifier 13 is connected to a reference voltage Vcc applied at terminal T1 and, similarly, current mirror circuit 11 is connected through the respective emitter circuits of transistors Q11, Q12, and Q16 and respective resistors R11, R12, and R16 to the reference voltage Vcc. In addition, the emitter circuit of transistor Q11 has a capacitor C11 connected in parallel with resistor R11 to reduce the possibility of induced oscillations of current mirror circuit 11.

The collector of transistor Q14 forming the other half of differential amplifier 13 is connected to the collector of transistor Q16, which is also connected to the common base circuit of current mirror circuit 11. This connection of the collector of transistor Q14 is the output of differential amplifier 13, which operates in the known fashion to produce an output that represents the difference between the two inputs. In this regard, the other input is the base circuit of transistor Q14 that is connected to the common point of diodes D1 and D2. Also connected to diodes D1 and D2 is constant current source Q9, which is also connected to relative ground potential. Thus, a series circuit is formed of diode D1 having its anode connected to reference voltage Vcc at terminal T1 and its cathode connected to the anode of diode D2, whose cathode is then connected to relative ground potential through constant current source Q9. The common connection point of diodes D1 and D2 is connected to maintain a voltage on the base circuit of transistor Q14 of the differential amplifier 13. Accordingly, current mirror circuit 11 and differential amplifier 13 cooperate to provide an amplified output current, such that by selecting the ratio of the resistances of resistors R11 and R12 the output current of transistor Q12 can be controlled appropriately. More particularly, the ratio between collector current I11 of transistor Q11 and the collector current I12 of transistor Q12 can be represented as:

$$I11:I12 = 1:\gamma \qquad (2)$$

In the embodiment shown in FIG. 1 $\gamma$ is determined as being equal to $2\pi/(\pi-2)$.

A current combining circuit 21 is provided to produce one of the desired output signals, and is comprised of transistors Q21, Q22, and Q24 cooperating with transistor Q23, which as described above forms part of the main current mirror circuit 10. Transistors Q21 and Q22 have their collector circuits and emitter circuits connected in common, and the common emitter circuits are connected to ground through the collector-emitter path of transistor Q23 and resistor R23, which is in the collector circuit of transistor Q23. Transistor Q23 forms one of the output sides of current mirror circuit 10 and, thus, the base circuit of transistor Q23 is connected to the common base circuit of transistors Q0, Q3, and Q43, whereby the current flowing in the collector circuit of transistor Q23 is the output current ic, which is the mirror of input current ic. This is the complex or composite current signal provided by the signal current source Sc. Transistor Q24 also forms part of the current combining circuit 21 and has its emitter circuit connected to the collector circuit of transistor Q12, which is the output side of current mirror 11, which is also connected to the common collector circuit of transistors Q21 and Q22 of the current combining circuit 21. The base drive of transistor Q24 is fixed by series-connected diodes D1 and D2 and, specifically, is connected at the cathode of diode D2 where it is its connected to the constant current source Q9. The output from current combining circuit 21 is taken off at the collector circuit of transistor 24, is connected to relative ground potential through a parallel circuit formed of capacitor C24 and R24. The capacitor C24 provides deemphasis and the resistor provides an output voltage.

Thus, the output voltage at terminal T21 represents the right channel audio signal having been demultiplexed and demodulated. Accordingly, the present invention provides additional left circuitry identical to the right channel for producing the left channel signal, that is, current mirror circuit 31, corresponding to current mirror circuit 11, is provided cooperating with differential amplifier 33, corresponding to differential amplifier 13, and current combining circuit 41 is provided, corresponding to current combining circuit 21. More specifically, current mirror circuit 31 is formed of transistors Q31, Q32, and Q36 each having its corresponding emitter circuit connected through an emitter resistor R31, R32, and R36, respectively, to the reference voltage Vcc at terminal T1. The base circuits of transistors Q31, Q32, and Q36 are connected in common with the base circuit being pulled to a voltage level by connecting the collector and base circuits together in transistor Q36. The output current of the current mirror is amplified by differential amplifier 33 comprised of transistors Q33 and Q34 having their emitters connected in common through a constant current source Q35 to relative ground potential. The collector circuit of transistor Q33 is referenced at the voltage Vcc and the collector circuit of transistor Q34, which represents the output of differential amplifier 33, is connected to the collector of transistor Q36. One input of differential amplifier 33 is fed to the base circuit of transistor Q34 and is connected to the connection point between diodes D1 and D2, as is the base circuit of transistor Q14 of the first differential amplifier 13, and the other input is base circuit of transistor Q33, which is the output current i1 from switching circuit 1. Also connected to the base circuit of transistor Q33 is the collector circuit of transistor Q31, which is the input side of the current mirror circuit 31 and which also receives the output signal current from the balanced switching circuit 1.

Current combining circuit 41 is comprised of transistors Q41, Q42, and Q44 in cooperation with the transistor Q43, which forms an output side of current mirror circuit 10. As in the current combining circuit 21, transistors Q41 and Q42 have their collector circuits connected in common and their emitter circuits connected in common, with the collector circuits receiving the amplified output current signal from current mirror circuit 31. The common emitter circuits are connected to ground potential through the collector-emitter path of transistor Q43 and resistor 43, which form an output side of the main current mirror circuit 10. The base of transistor Q41 is connected to the base circuit of transistor Q21 of current combining circuit 21 and both are driven by a switching signal from switching signal generator S38. The base drive of transistor Q42 is connected to the base drive of transistor Q22 of current combining circuit 21, which are both driven by another switching output signal from switching signal generator S38. The left channel output is then provided by the collector circuit of transistor Q44 at terminal T41, which is connected to ground through a parallel combination of capacitor C44 and resistor R44. Capacitor C44 provides deemphasis, and resistor R44 provides an output voltage from the current signal.

Thus, according to the embodiment of the present invention shown in FIG. 1 and as described in detail hereinabove, a demodulator switching circuit 1 of the double-balanced kind is provided with a demodulation switching signal produced by signal generator S38 and is connected to receive a composite signal current ic derived by the use of a current mirror circuit 10 driven by the source Sc of the modulated, multiplex FM stereo signals. The outputs of the demodulator switching circuit are fed to respective left and right channels each formed having a current mirror circuit and differential amplifier with the output current signals of the current mirror circuits being combined in respective current combining circuits 21 and 41.

The manner in which the embodiment of FIG. 1 operates is as follows. Because the composite signal current ic produced by the constant signal source Sc is supplied through current mirror circuit 10 to the emitter circuits of transistors Q1 and Q2 and the switching signal from switching signal source S38 is supplied to the base circuits of transistors Q1 and Q2, switching demodulation is carried out in switching circuit 1. Thus, in the collector circuits of transistors Q1 and Q2 a signal current i1 and i2 are caused to flow which may be expressed as:

$$i1 = \frac{\pi + 2}{2\pi} L + \frac{\pi - 2}{2\pi} R \qquad (3)$$

$$i2 = \frac{\pi + 2}{2\pi} R + \frac{\pi - 2}{2\pi} L \qquad (4)$$

These expressions for the left and right channel signals are obtained in accordance with the well-known text book derivation. Additionally, at this time when currents i1 and i2 are produced because the DC components of the collector currents of transistors Q3 and Q6 are of equal magnitude and because the collector currents of transistors Q1 and Q2 are switched in opposite polarity in relation to the collector currents of transistor Q4 and Q5, due to the respective connections to switching signal generator S38, the synthesized collector currents of transistors Q1, Q4, Q2, and Q5 will contain no switching signal component, that is, they will contain no component of the 19 kHz switching circuit signal produced by generator S38.

Therefore, signal current i2, represented in equation (4) hereinabove, is supplied to current mirror circuit 11 and because the base of transistor Q14 is connected to ground through diode D1 and constant current source Q9, that is, it is a AC coupled to ground, transistors Q13, and Q14 operate as differential amplifier 13 so that the base current i2 of the transistor Q13 output from switching circuit 1 is amplified by differential amplifier 13 and fed through transistors Q16 to transistors Q11 and Q12 as the base current thereof. Accordingly, as a result of this operation transistors Q11 and Q12 operate as current mirror circuit 11, with transistor Q11 as the input side. Therefore, because signal current i2 is supplied to the input side transistor Q11 and because the collector currents of transistors Q11 and Q12 are determined as in equation (1) above, an amplified signal current $\gamma i2$ is caused to flow in the collector circuit of transistor Q12, which represents the output side of current mirror 11.

Now, because transistor Q23 is one of the output sides of main current mirror circuit 10, which has transistor Q0 at the input side thereof, output signal current ic from current combining circuit 21 is caused to flow into the collector circuit of transistor Q23. Because either of one or the other transistors Q21 and Q22 will be turned on by the switching signal from switching generator S38, the signal current ic will then be caused to flow into the collector circuit of the corresponding one of transistors Q21 or Q22.

Therefore, signal current i24, which corresponds to the difference between signal current γi2 of transistor Q12 of current mirror circuit 11 and signal current ic which flows through transistors Q21 or Q22 under action of current mirror circuit 10 will be caused to flow into the emitter circuit of transistor Q24. This difference current i24 can be represented as follows:

$$i24 = \gamma i2 - ic \quad (5)$$

$$i24 = \frac{2\pi}{\pi - 2}\left(\frac{\pi + 2}{2\pi} R + \frac{\pi - 2}{2\pi} L\right) -$$

$$[(L + R) + (L - R) \sin\omega t]$$

$$= \frac{4}{\pi - 2} R - (L - R) \sin\omega t \quad (6)$$

Now, because the base circuit of transistor Q24 is connected to ground through constant current source Q9 and diodes D1 and D2 in AC coupled fashion, transistor Q24 is operated as in the base-grounded configuration and signal current i24 will be caused to flow through the emitter circuit of transistor Q24 and to be available at output terminal T21 as the right channel audio signal. This output current signal i24 is then represented as a voltage at T21 by resistor R24 connected between the collector circuit of transistor Q24 and relative ground potential. As indicated above, deemphasis of the output is generally required and, accordingly, because capacitor C24 is connected in parallel to resistor R24, the subchannel signal component having the angular frequency ω is by-passed, and the right channel signal R is developed at terminal T21. The deemphasis provided by capacitor C24 is necessary only when the originally transmitted signal has been emphasized prior to transmission, that is, it is typically known to emphasize the transmitted signal at the high frequency end, because such high frequency signals tend to be attenuated more during transmission. Accordingly, some deemphasis is desirable at the receiver end, such as provided by a circuit represented by capacitor C24 in FIG. 1.

The relationship between the left and right channel signals L and R, respectively, in signal current i1 is opposite to that as described hereinabove in relation to signal current i2 and, therefore, the left channel signal L is developed at terminal T41 in substantially the same fashion. Again, deemphasis is provided by capacitor C44 connected between the collector circuit of transistor Q44 and ground potential. By action of differential amplifier 33 driving current mirror circuit 31 so that the appropriate currents can be combined in current combining circuit 41 to produce the output at terminal T41, and this operation is identical to that described hereinabove with relation to differential amplifier 13 and current mirror circuit 11 operating in cooperation with current combining circuit 21.

Thus, at terminals T41 and T21 are developed the left and right channel audio signals L and R, respectively, which are selectively demodulated from the composite signal current ic by the switching of switching circuit 1, in which the crosstalk component is substantially cancelled. Additionally, deemphasis is provided of the output voltage signals.

Thus, according to the present invention, because all circuit elements are operated by currents, not by voltage references, even if the power source voltage Vcc at terminal T1 is low it is possible to obtain the desired audio signals L and R with a relative large amplitude, low distortion, and a good signal-to-noise ratio. It has been found through tests with the circuit of FIG. 1 that satisfactory signal-to-noise ratio and acceptable distortion characteristics are obtained even when the power source voltage is 1.8 volts.

Because the present invention, as set forth hereinabove in connection with FIG. 1, operates in the current domain, when the FM stereo multiplex demodulator described herein as formed as an integrated circuit even if the values of each element are not identical, for example, if the forward current gain hfe of the complementary pairs of transistors are not equal, the crosstalk characteristic is unaffected and remains excellent. Thus, a principal feature of the FM stereo multiplex demodulator taught by the present invention is its ready adaptability to being formed as an integrated circuit.

Figure 2:
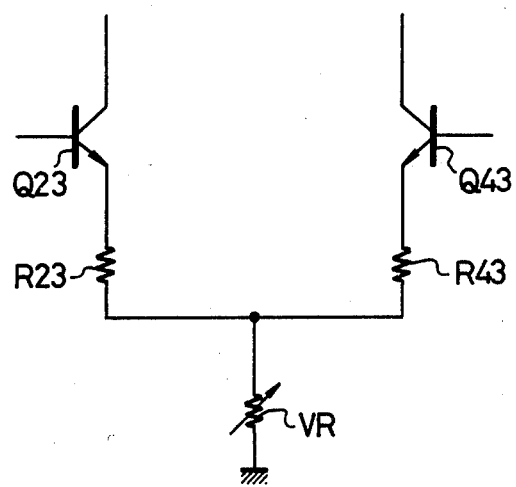
FIG. 2 is a schematic of an embodiment of a channel separation circuit suitable for use in the embodiment of FIG. 1.
Figure 3:
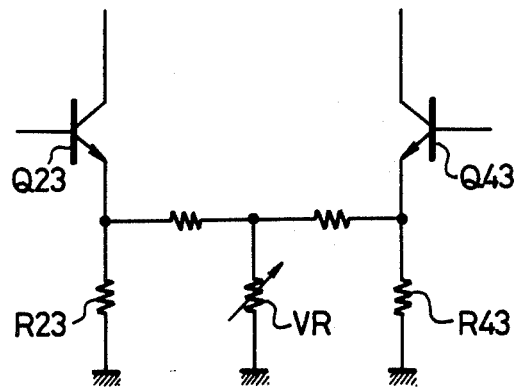
FIG. 3 is a circuit diagram of another embodiment of a channel separation circuit suitable for use in the circuit of FIG. 1.

Additionally, when it is desired to adjust the channel separation in the FM stereo multiplex demodulator one need only adjust the resistance resistor R23 so as to vary the the magnitude of output signal current ic, as represented in equation (2) hereinabove. Various embodiments for obtaining a variable resistance for resistor R23 are possible, and FIG. 2 represents the output of transistors Q23 and Q43 which form output sides of the current mirror circuit 10 being connected with their respective resistors R23 and R43 to ground potential through a variable resistor VR. Operation of this variable resistor VR provides adjustment for separation between the left and right channel signals. A similar effect is obtained by the circuit of FIG. 3 in which in place of the series connection of FIG. 2 the variable resistor VR is connected in parallel with the respective emitter resistors R23 and R43 of transistors Q23 and Q43 of current mirror circuit 10.

Thus, according to the present invention an FM stereo multiplex demodulator is provided that can produce the left and right channel audio signals having excellent signal-to-noise ratio and low distortion characteristics, even when the power source voltage is low. Moreover, the FM stereo multiplex demodulator does not involve and unacceptable crosstalk characteristic and is intended to be formed as an intergrated circuit.

Although illustrative embodiments of the present invention have been described in detail above with reference to the accompanying drawings, it is to be understood that the invention is not limited to those precise embodiments, and that various changes and modifications can be effected therein by one skilled in the art without departing from the scope or spirit of the invention, as defined by the appended claims.

What is claimed is:

1. Apparatus for demodulating an FM stereo multiplex signal, comprising:

a signal generator producing a switching signal having a frequency related to a carrier frequency of said FM stereo multiplex signals;

a double-balanced switching circuit connected to receive said switching signal from said signal generator;

a first current mirror circuit receiving said FM stereo multiplex signal for providing therefrom an output current signal fed to said switching circuit, whereby said switching circuit produces first and second corresponding output current signals;

second and third current mirror circuits connected respectively to receive said first and second output current signals from said switching circuit and each producing a respective output current signal therefrom;

first signal combining circuit for producing a current output signal corresponding to a difference between said output current signal from said second current mirror circuit and said output current signal from said first current mirror circuit; and second signal combining circuit for producing a current output signal corresponding to a difference between said output current signal from said third current mirror circuit and said output current signal from said first current mirror circuit.

2. Apparatus according to claim 1, further comprising first and second differential amplifier means associated respectively with said second and third current mirror circuits for causing said second and third current mirror circuits to provide respective amplified output current signals fed respectively to said first and second signal combining circuits.

3. Apparatus according to claim 1, in which said first and second differential amplifier means each have one input receiving a respective output current signal from said switching circuit and another input coupled via alternating current to ground potential by diode means.

4. Apparatus according to claim 1, in which said first and second signal combining circuits include separation adjustment means, whereby separation between respective output current signal of said first signal combining circuit and said second signal combining circuit is controlled.

5. Apparatus according to claim 4, in which said separation adjusting means comprises a variable resistance element connected in series between said first and second signal combining means and ground potential.

6. Apparatus according to claim 4, in which said separation adjustment means comprises first and second junctions comprising first and second fixed resistances connected between ground potential and said first and second signal combining means, respectively, and third and fourth fixed resistances respectively connected to said first and second junctions, and commonly fed by a variable resistance connected to ground potential.

7. Apparatus for demodulating an FM stereo multiplex signal, comprising:

switching circuit means including double-balanced transistor elements connected to receive a switching signal having a frequency related to a carrier frequency of said FM stereo multiplex signal;

first current mirror circuit receiving said FM stereo multiplex signal and producing therefrom said switching signal fed to said switching circuit, said switching circuit producing therefrom first and second output current signals;

second and third current mirror circuits connected respectively to receive said first and second output current signals from said switching means for producing a respective output current signal therefrom;

first signal difference circuit for producing an output current signal corresponding to a difference between said output current signal from said second current mirror circuit and said output current signal from said first current mirror circuit; and second signal difference circuit producing an output current signal corresponding to a difference between said output current signal from said third current mirror circuit and said output current signal from said first current mirror circuit.

8. Apparatus according to claim 7, further comprising first and second differential amplifier means associated respectively with said second and third current mirror circuits for causing said second and third current mirror circuits to produce amplified output current signals fed respectively to said first and second signal difference circuits.

9. Apparatus according to claim 8, in which said first and second differential amplifier means each include an input receiving a respective output current signal from said switching circuit and each having a second input AC coupled to ground potential by diode means.

10. Apparatus according to claim 7, in which said first and second signal difference circuits include means for adjusting separation between said output current signal from said first signal difference circuit and said output current signal from said second difference circuit.

11. Apparatus according to claim 10, in which said means for adjusting separation includes a variable resistance element connected in series with said first signal difference circuit and ground potential.

12. Apparatus according to claim 10, in which said separation adjustment means comprises first and second junctions comprising first and second fixed resistances connected between ground potential and said first and second signal combining means, respectively, and third and fourth fixed resistances respectively connected to said first and second junctions, and commonly fed by a variable resistance connected to ground potential.

13. A demodulator for producing left and right channel audio signals from a modulated composite FM stereo multiplex signal, comprising:

a first current mirror circuit having an input side and an output side and receiving said composite FM stereo signal at said input side for producing a plurality of identical corresponding output current signals therefrom;

means generating a switching signal having a frequency related to a carrier frequency of said composite FM stereo multiplex signal;

switching circuit means receiving at least one of said plurality of output current signals from said current mirror circuit and receiving said switching signal for producing first and second composite output current signals;

a second current mirror circuit having an input side receiving said first output current signal from said switching circuit for producing at said output side a corresponding current signal;

a third current mirror circuit having an input side receiving said second output current signal from said switching means for producing at said output side a corresponding current signal;

first current difference circuit for producing a current output signal corresponding to a difference between said output current signal from said second current mirror circuit and one of said plurality of output current signals from said output side of said first current mirror circuit; and second current difference circuit for producing a current output signal corresponding to a difference between an output current signal from said third current mirror circuit and one of said plurality of said current signals from said output side of said first current mirror circuit.

14. Apparatus according to claim 13, further comprising first and second differential amplifier means associated respectively with said second and third current mirror circuits for causing said second and third current mirror circuits to provide respective amplified output current signals fed to said first and second current difference circuits, respectively.

15. Apparatus according to claim 14, in which said first and second differential amplifiers each have one input receiving a respective output current signal from said switching circuit and another input coupled via alternating current to ground potential by diode means.

16. Apparatus according to claim 13, in which said first and second signal current difference circuits include separation adjustment means, whereby separation between respective oututs of said first current difference circuit and said second current difference circuit can be controlled.

17. Apparatus according to claim 16, in which said separation adjusting means comprises a variable resistance element connected in series between said first and second current difference circuits and ground potential.

18. Apparatus according to claim 16, in which said separation adjustment means comprises first and second junctions comprising first and second fixed resistances connected between ground potential and said first and second signal combining means, respectively, and third and fourth fixed resistances respectively connected to said first and second junctions, and commonly fed by a variable resistance connected to ground potential.

* * * * *